United States Patent
Furuya

(10) Patent No.: US 7,363,205 B2
(45) Date of Patent: Apr. 22, 2008

(54) TOPOLOGY SIMULATION SYSTEM, TOPOLOGY SIMULATION METHOD, AND COMPUTER PRODUCT

(75) Inventor: Atsushi Furuya, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 321 days.

(21) Appl. No.: 10/941,946

(22) Filed: Sep. 16, 2004

(65) Prior Publication Data

US 2005/0278060 A1 Dec. 15, 2005

(30) Foreign Application Priority Data

May 25, 2004 (JP) .................. 2004-155262

(51) Int. Cl.
*G06F 7/48* (2006.01)
(52) U.S. Cl. .......................................... 703/7
(58) Field of Classification Search ................ 703/7
See application file for complete search history.

(56) References Cited

U.S. PATENT DOCUMENTS

| 5,282,140 A | * | 1/1994 | Tazawa et al. | ............... 700/98 |
| 5,367,465 A | * | 11/1994 | Tazawa et al. | ............... 700/98 |
| 5,377,118 A | * | 12/1994 | Leon et al. | ............... 700/182 |
| 5,379,225 A | * | 1/1995 | Tazawa et al. | ............... 700/98 |
| 5,586,230 A | * | 12/1996 | Leon et al. | ............... 345/420 |
| 6,199,029 B1 | | 3/2001 | Ohta | |

FOREIGN PATENT DOCUMENTS

| JP | 63-1034 A | 1/1988 |
| JP | 10-326756 A | 12/1998 |
| JP | 2000-269105 A | 9/2000 |

OTHER PUBLICATIONS

Scheckler et al, "Models and Algorithms for Three-Dimensional Topography Simulation with SAMPLE-3D", IEEE Tranactions on Computer-Aided Design of Integrated Circuits and Systems, vol. 13, No. 2, Feb. 1994.*

Fujinaga et al, "3-D Topography Simulator (3-D MULSS) Based on a Physical Description of Material Topography", IEEE Transactions on Electron Devices, vol. 44, No. 2, Feb. 1997.*

* cited by examiner

*Primary Examiner*—Paul Rodriguez
*Assistant Examiner*—Luke Osborne
(74) *Attorney, Agent, or Firm*—Staas & Halsey LLP

(57) ABSTRACT

A matrix computing unit evaluates visual properties influenced by a positional relationship between surface elements of an element so that a shading effect and a re-deposition effect are reflected to the simulation results. A beam condition computing unit calculates beam conditions according to a position of the element on a wafer so that a difference in machined topologies caused by a positional difference on the wafer is reflected to the simulation results.

18 Claims, 13 Drawing Sheets

FIG.4

| TIME | ELEVATION ANGLE | AZIMUTH ANGLE | INTENSITY | DIVERGENCE ANGLE |
|---:|---:|---:|---:|---:|
| 0.00 | 40.00 | 100.000 | 1.00 | 8.000 |
| 28.13 | 40.00 | 75.000 | 1.10 | 8.000 |
| 56.25 | 40.00 | 50.000 | 1.10 | 8.000 |
| 84.38 | 40.00 | 25.000 | 1.05 | 8.000 |
| 112.50 | 40.00 | 0.000 | 1.00 | 8.000 |
| 140.63 | 40.00 | -25.000 | 1.00 | 8.000 |
| 168.75 | 40.00 | -50.000 | 0.80 | 8.000 |

FIG.9

| WAFER DIAMETER(mm) | |
| X COORDINATE (mm) | |
| Y COORDINATE (mm) | |

| NUMBER | X COOR-DINATE (mm) | Y COOR-DINATE (mm) |
|---|---|---|
| 1 | 20 | 10 |
| 2 | 40 | -40 |
| 3 | -15 | -15 |

ADDITION  DELETION

FIG.10

SURFACE DATA NAME

READING

TOPOLOGY SIMULATION SYSTEM, TOPOLOGY SIMULATION METHOD, AND COMPUTER PRODUCT

BACKGROUND OF THE INVENTION

1) Field of the Invention

The present invention relates to a technology for simulating a topological change of a product caused by a micro-machining process with a high precision.

2) Description of the Related Art

In recent years, along with developments in machining techniques, miniaturization of semiconductor memories and MR heads has progressed greatly, and under this circumstance, the investment cost for forming the manufacturing processes of these products is increasing. Upon forming the manufacturing processes of these finely-machined products, it is very important to preliminarily simulate a topological change of a product after the machining processes so as to solve possible problems beforehand.

With respect to the invention used for simulating a topological change due to a micro-machining process, Japanese Patent Application Laid-Open No. 10-326756 has proposed a topology simulation system which can carry out high-speed simulation computing processes on an etched topology with high precision by using a Monte Carlo method.

Moreover, Japanese Patent application Laid-Open No. 63-1034 has proposed a method in which precision of a dry-etched topology simulation is improved by taking the incident direction of etching particles into consideration.

Furthermore, Japanese Patent Application Laid-Open No. 2000-269105 has proposed a process simulation system and a process simulation method in which a physical model, which indicates a physical phenomenon on an interface, is changed in response to properties of the interface with silicon so that simulation precision is improved.

However, along with the developments in micro-machining techniques, simulating processes by these systems and methods have come to fail to provide sufficient precision. The reason for this is because phenomena caused by shading effects and re-deposition effects and a difference in machined topologies depending on positions on a wafer, which can be ignored in conventional devices, have become influential to quality of a product due to advanced miniaturization in semiconductor memories and the like.

Moreover, with respect to the shading effect and re-deposition effect, the conventional two-dimensional simulation has failed to deal with these effects, and a three-dimensional simulation process is required; however, the three-dimensional simulation process requires a large amount of calculations, resulting in a problem of an increased processing time.

SUMMARY OF THE INVENTION

It is an object of the present invention to solve at least the above problems in the conventional technology.

A topology simulation system according to one aspect of the present invention includes a matrix computing unit that creates a surface-related matrix by evaluating visual properties according to a positional relationship in a three-dimensional space between surface elements obtained by dividing each surface of the product into a polygon; and a speed computing unit that calculates a surface shifting speed of the surface element to which a shading effect and a re-deposition effect is reflected by using the surface-related matrix created by the matrix computing unit.

A topology simulation system according to another aspect of the present invention includes a user interface control unit that receives inputs of a composition of a machining process in a micro-machining process and beam characteristics of a beam used for the micro-machining process; and a beam condition calculating unit that calculates intensity and direction of the beam to be applied to the product to carry out the micro-machining process, based on the composition of the machining process and the beam characteristics.

A topology simulation method according to still another aspect of the present invention includes creating a surface-related matrix by evaluating visual properties according to a positional relationship in a three-dimensional space between surface elements obtained by dividing each surface of the product into a polygon; and calculating a surface shifting speed of the surface element to which a shading effect and a re-deposition effect is reflected by using the surface-related matrix created by the matrix computing unit.

A topology simulation method according to still another aspect of the present invention includes receiving inputs of a composition of a machining process in a micro-machining process and beam characteristics of a beam used for the micro-machining process; and calculating intensity and direction of the beam to be applied to the product to carry out the micro-machining process, based on the composition of the machining process and the beam characteristics.

A computer-readable recording medium according to still anther aspect of the present invention stores computer programs for realizing the topology simulation methods according to the above aspects on a computer.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 4 is a data structural diagram that indicates one example of beam condition information;

FIG. 9 is a sample diagram of an input screen for element initial position information;

FIG. 10 is a sample diagram of an input screen for initial surface topology information;

DETAILED DESCRIPTION

Exemplary embodiments of a topology simulation system, a topology simulation method and a computer product according to the present invention are explained in detail with reference to the accompanying drawings. First, a micro-machining process that is subjected to simulation processes by the topology-simulation system, the topology simulation method, and the topology-simulation program of the present embodiments is explained briefly, and a case in which the topology-simulation system, the topology simulation method, and the topology-simulation program of the present embodiments are applied to a machining process of a semiconductor is then explained.

To machine a fine structure such as a hard disk head, at present, an ion milling method has been widely used. According to ion milling method, ions such as argon ions are accelerated and applied to a surface of machining subject so that the surface of machining subject is physically ground and cut to cause a topological change.

Figure 1:
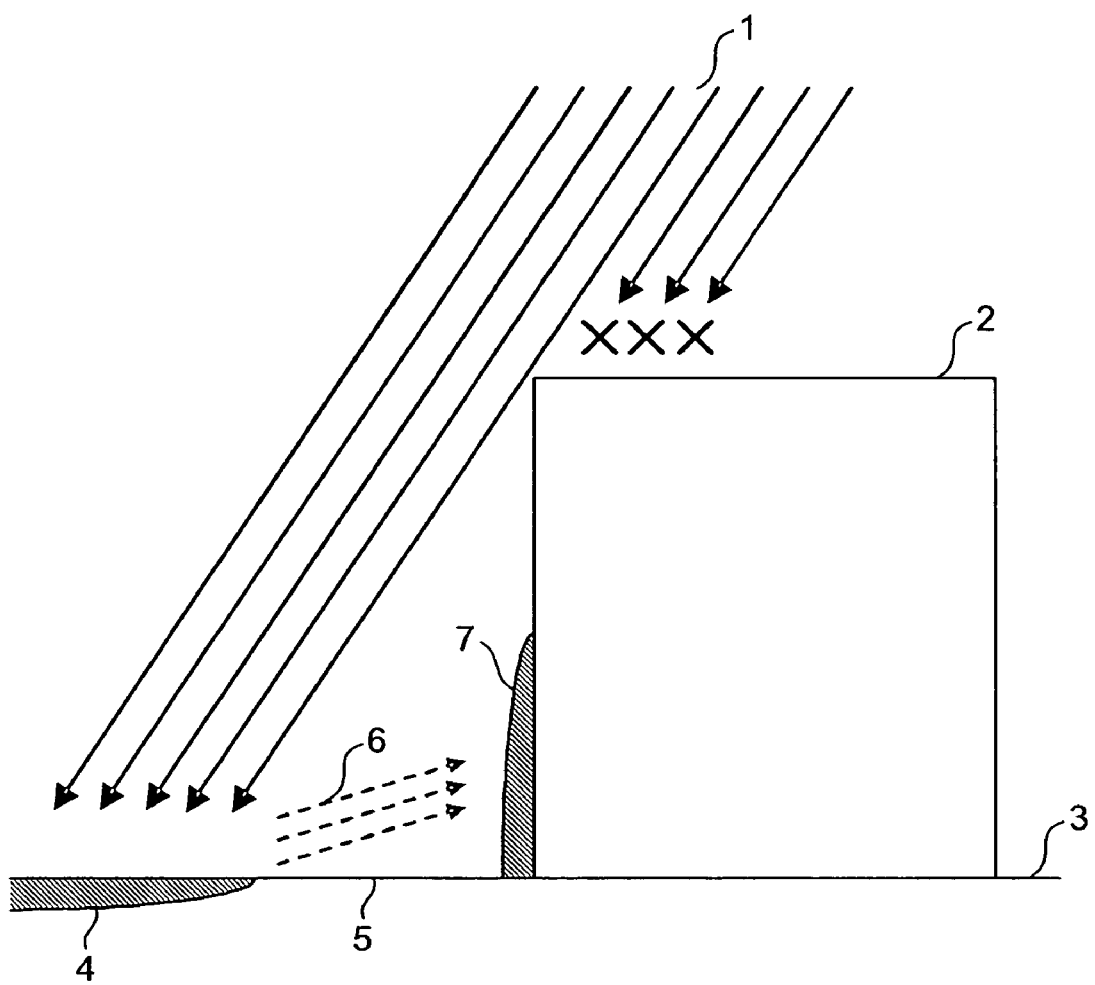
FIG. 1 is an explanatory diagram that explains a micro-machining process through an ion milling method.

FIG. 1 is an explanatory drawing that explains the micro-machining process through the ion milling method. An ion beam 1 that corresponds to accelerated ion particles is applied to a surface of machining subject 3 with a predetermined incident angle so that the surface of machining subject 3 is ground and cut to form an etched section 4. At this time, when a three-dimensional object such as a machined topology 2 is present on the surface of machining subject 3, the ion beam 1 does not reach a portion shaded by the machined topology 2 so that a non-etched unit 5 is formed (hereinafter, "shading effect"). Moreover, particles, ground and cut by the ion beam 1, are scattered and allowed to adhere to the peripheral portion to form an adhesion portion 7 (hereinafter, "re-deposition effect").

As the structure of LSIs and the like has become finer, influences from the shading effect and the re-deposition effect become greater; therefore, it becomes important and necessary to confirm the influences of these effects in micro-machining processes during simulation processes.

Moreover, in a micro-machining process for LSIs or the like, a manufacturing method in which a plurality of chip patterns are simultaneously formed on a disc-topology material referred to as a wafer so that this is cut and divided into IC chips has been normally used. However, the ion beam irradiation by the ion milling method is not necessarily carried out evenly over the entire surface of a wafer, and depending on characteristics of machining devices, for example, stronger beams are directed to the center portion of the wafer with the irradiation becoming weaker toward the peripheral portion; thus, the intensity of beam irradiation is different depending on portions of the wafer. For this reason, even in the case of LSIs having the same chip pattern, chips derived from the center portion of the wafer tend to have a surface topology that is different from that of chips derived from the peripheral portion of the wafer.

In the same manner as the shading effect and the re-deposition effect, the difference in surface topologies depending on the formation position on the wafer becomes more influential as the structure of LSIs and the like becomes finer, and it becomes important and necessary to confirm differences in machined topologies depending on formation positions in micro-machining processes during simulation processes.

Figure 2:
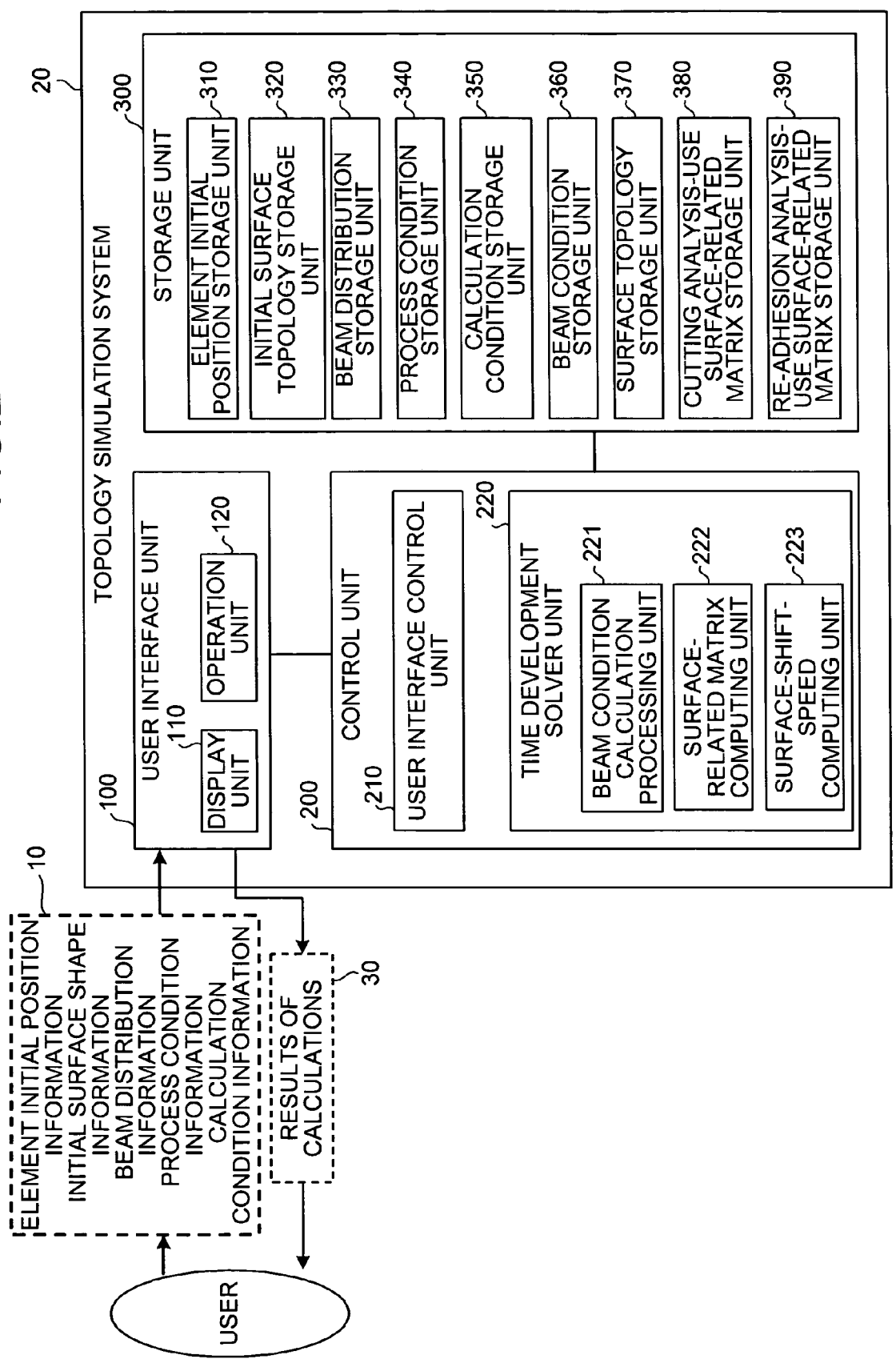
FIG. 2 is a functional block diagram that explains a structure of topology-simulation system according to the present embodiment.
Figure 3A:
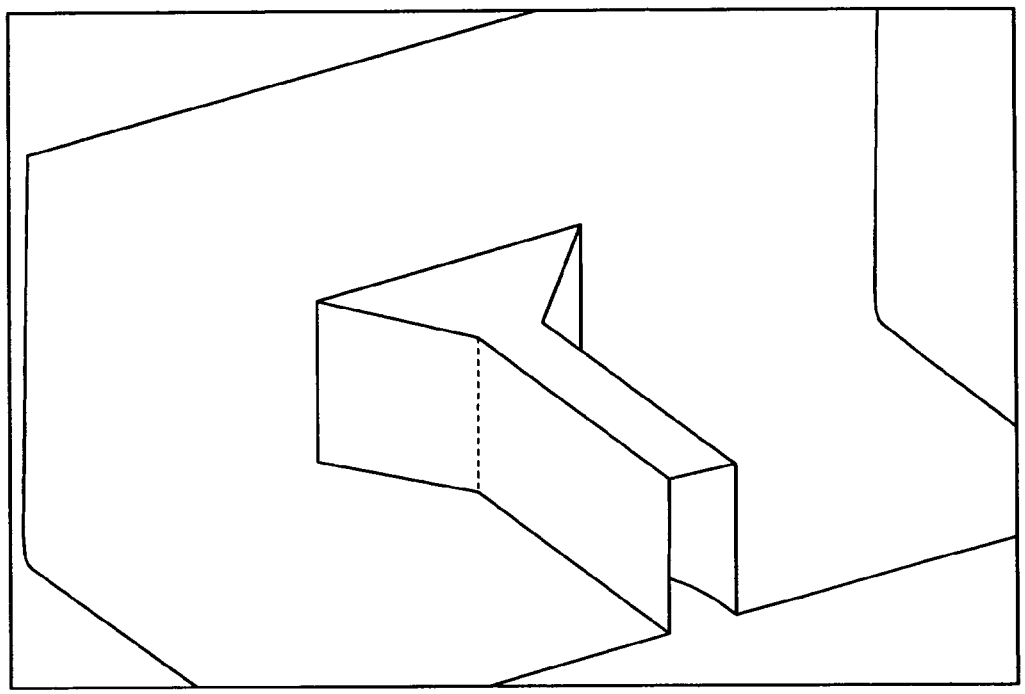
FIG. 3A is a sample drawing that shows an initial topology.
Figure 3B:
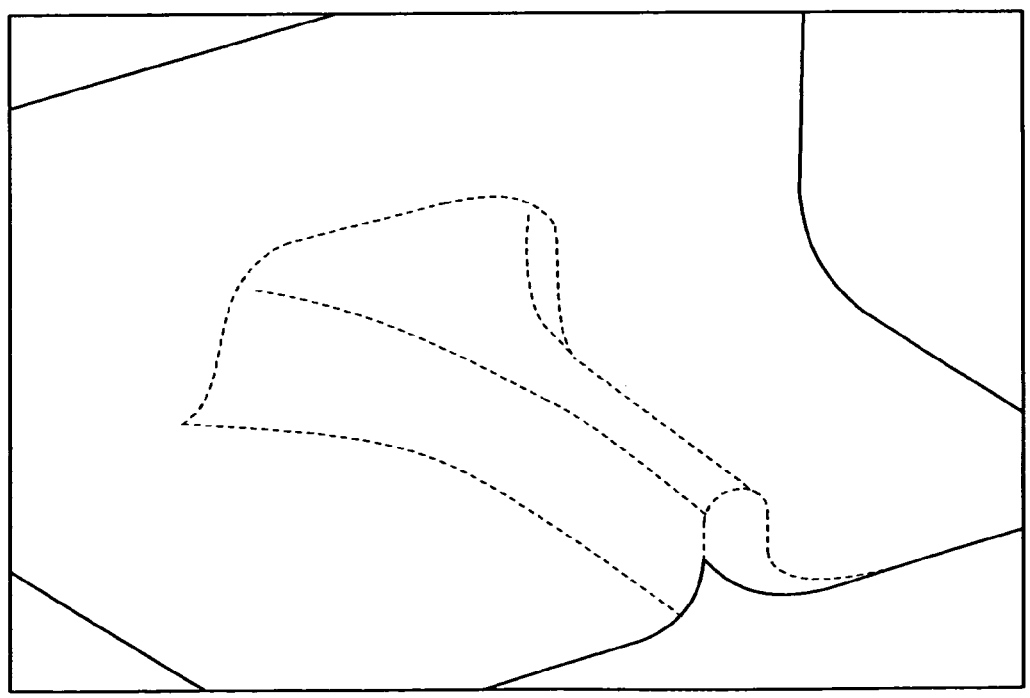
FIG. 3B is a sample drawing that shows a topology after a simulation.
Figure 5:
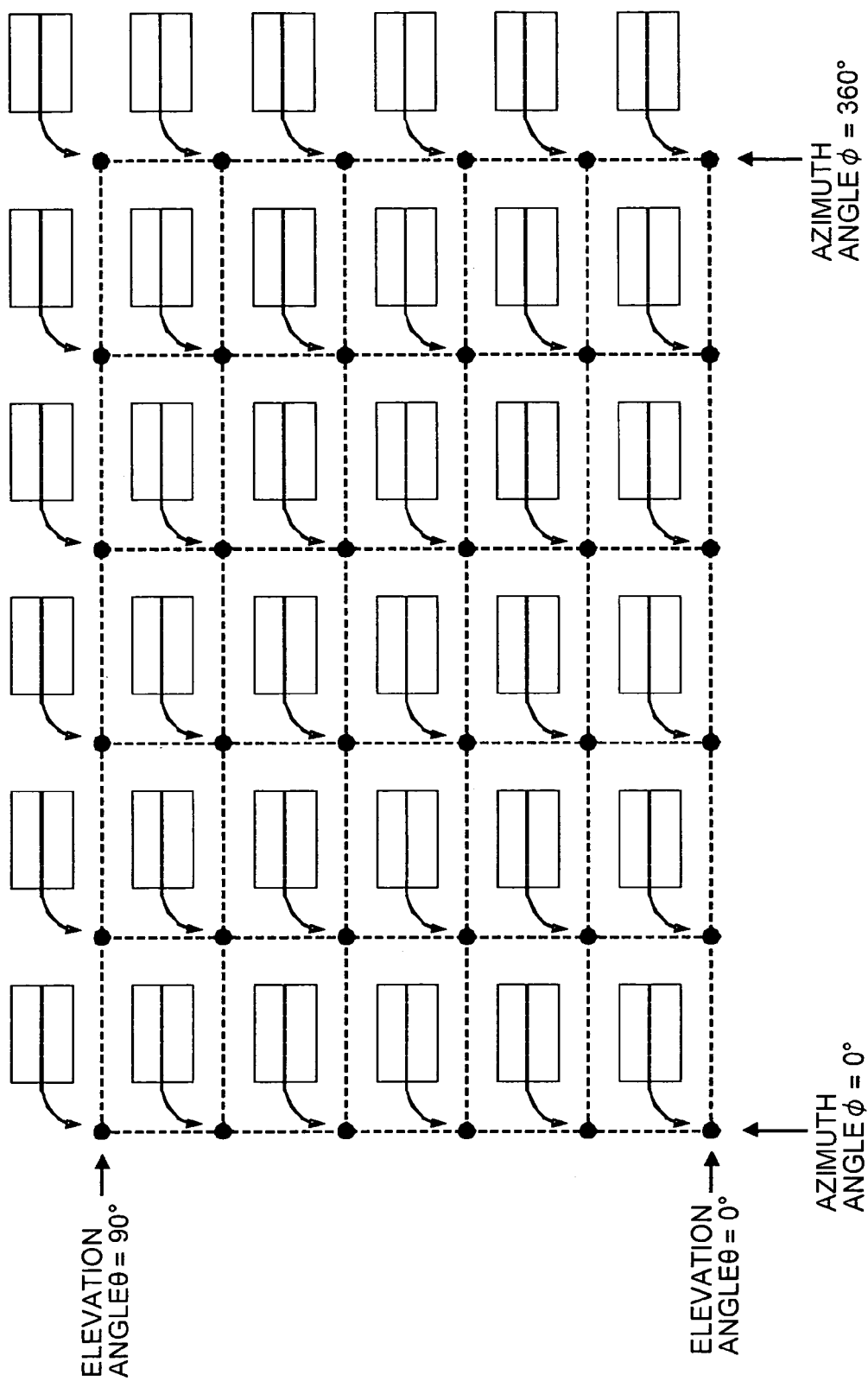
FIG. 5 is an explanatory diagram that explains a surface-related matrix upon initialization.

FIG. 2 is a functional block diagram that shows a structure of a topology simulation system according to the present embodiments. A topology simulation system 20 has functions which receives input information 10 including element initial position information, initial surface topology information, beam distribution information, process condition information, and calculation condition information, and outputs the corresponding topology after the machining process as the results of calculations 30. FIG. 3A is a sample drawing that shows an initial topology that corresponds to the initial surface topology information of the input information 10. FIG. 3B is a sample drawing that shows a simulated topology that corresponds to the results of calculations 30.

As shown in FIG. 2, the topology simulation system 20 is provided with a user interface unit 100, a control unit 200, and a storing unit 300. The user interface unit 100 has a display unit 110 constituted by a liquid crystal device capable of displaying characters and images, and the like, and an operation unit 120 constituted by a keyboard, a mouse and the like to be used for receiving the user's operations.

The control unit 200, which controls the entire topology simulation system 20, is provided with a user interface control unit 210 and a time development solver 220. The user interface control unit 210 controls the user interface unit 100.

The time development solver 220, which is a processing unit for carrying out simulations based upon the input information, has a beam condition computing unit 221, a matrix computing unit 222 and a surface shift-speed computing unit 223.

The beam condition computing unit 221 finds out through calculations what position on a wafer an element to be simulated is located at a point of elapsed time in the middle of a machining process based upon the element initial position information, the beam distribution information and the process condition information, and calculates the beam incident angle and intensity (hereinafter, "beam conditions") at the corresponding position.

The topology simulation system 20 divides the machining process into fine phases, and calculates a topology change for each phase, and by accumulating topology changes for the respective phases, simulates the topology of the element to be finally formed; however, to calculate the topology change in the element for each phase, the beam conditions at the corresponding point of time are required. The beam condition computing unit 221 calculates the beam conditions based upon the element initial position information, beam distribution information and process condition information inputted by the user.

A conventional topology simulation system is designed so that the user calculates beam conditions for each phase to input the resulting values, with the result that a great burden is imposed on the user and erroneous simulation results might be produced due to the user's calculation error. The beam condition computing unit 221 calculates beam conditions so that it becomes possible to efficiently carry out simulation processes and also to provide accurate simulation results.

Moreover, the calculations or the beam conditions, carried out by the beam condition computing unit 221, are also effectively used upon examining a difference in element topologies depending on formation positions of the wafer. In the case when elements are formed on the same wafer, the contents of the beam distribution information and the process condition information are the same, and even when only the element initial position information is specified, the calculations for the beam conditions are carried out by the beam condition computing unit 221 so that the simulation process can be executed. Therefore, once the user has specified the beam distribution information and process condition information, it is possible to simulate a topology of the element to be formed at any desired position on the wafer by only specifying the element initial position information; thus, it becomes possible to easily compare the topologies of the respective elements.

The matrix computing unit 222 is a processing unit which evaluates visual properties of the respective surface elements of an element to be simulated, which vary depending on positional relationships. As explained earlier, in a micro-machining process, the shading effect that causes an unetched unit due to a beam shaded by another topology and the re-deposition effect that causes re-deposition of particles ground and cut by a beam to adhere to another face tend to occur. To simulate these effects, it is necessary to three-dimensionally evaluate visual properties of the respective surface elements.

To simulate the shading effect, it is necessary to three-dimensionally evaluate how the respective surface elements of each element are superposed on one another with respect to the beam incident direction. Moreover, the re-deposition occurs only on the faces that are viewed from the face that has been ground and cut, and does not occur on faces that are shielded by the other surface elements; therefore, to evaluate the re-deposition effect, it is necessary to three-dimensionally evaluate visual properties of the respective surface elements.

The surface shift-speed computing unit 223 calculates the shifting speeds of the respective surface elements of an element to be simulated based upon the results of calculations by the beam condition computing unit 221 and the matrix computing unit 222, and allows the respective surface elements to shift according to the shifting speeds so that the topology is changed. The shifting speed, which corresponds to a speed obtained by totaling a negative shifting speed at which the surface is cut by the beam to retreat and a positive shifting speed at which the surface rises due to re-deposition, indicates a shift distance of the surface per unit time.

The storing unit 300 is provided with an element initial position storing unit 310, an initial surface topology storing unit 320, a beam distribution storing unit 330, a process condition storing unit 340, a calculation condition storing unit 350, a beam condition storing unit 360, a surface topology storing unit 370, a cutting analysis-use surface-related matrix storing unit 380, and a re-deposition analysis-use surface-related matrix storing unit 390.

The element initial position storing unit 310, the initial surface topology storing unit 320, the beam distribution storing unit 330, the process condition storing unit 340, and the calculation condition storing unit 350 respectively store input information. The element initial position storing unit 310 stores an initial position of an element to be formed on a wafer as a combination of an X coordinate and a Y coordinate. In the machining process, a wafer is rotated and the position of the element on the wafer is also shifted following the rotation, and the position at which the shift is started is stored in this unit.

The initial surface topology storing unit 320 stores the initial topology of the element formed on the wafer. The topology of the element is represented as a set of surface elements made of polygonal topologies (hereinafter, "polygons"), such as triangles, and the initial surface topology storing unit 320 stores the position and topology of each of these surface elements as coordinate information or vector information.

The beam distribution storing unit 330 stores information by which the intensity of a beam to be applied to the wafer is defined in a separate manner between the position on the wafer and the incident angle. Since the beam distribution is different depending on characteristics of a device to be used for a micro-machining process, information corresponding to the device to be simulated is stored in this unit.

The process condition storing unit 340 stores machining processes of each element. The process condition storing unit 340 is allowed to store a plurality of processes, and each process includes pieces of information relating to machining time, a tilt angle of the wafer, a divergence angle of a beam, and a rotation angle of the wafer.

The calculation condition 350 stores information relating to precision in simulation. The information relating to precision in simulation includes a time step that forms a unit of time by which the machining process is finely divided, and a number of divisions of polar coordinates to be used upon evaluating the visual properties of the surface elements of an element.

The beam condition storing unit 360 stores the results of calculations in the beam condition computing unit 221. More specifically, it stores the incident angle and intensity of a beam in each of phases that correspond to finely-divided machining processes. FIG. 4 is a data structural diagram that shows one example of the beam condition storing unit 360. As shown in FIG. 4, the beam condition storing unit 360 has items including time, elevation angle, azimuth angle, intensity, and divergence angle. The item of time indicates elapsed machining time. This time forms a multiple of the time step in the calculation condition storing unit 350. The items of elevation angle and azimuth angle represent an incident angle of a beam, and the item of intensity represents an intensity of the beam. The item of divergence angle holds the value of the divergence angle of a beam in the process condition storing unit 340.

The surface topology storing unit 370 stores the results of calculations by the surface shift-speed computing unit 223. The surface topology storing unit 370 stores the position and topology of each surface element that has been changed by irradiation with a beam as coordinate information or vector information.

The cutting analysis-use surface-related matrix storing unit 380 and the re-deposition analysis-use surface-related matrix storing unit 390 store the results of calculations by the matrix computing unit 222. Each of pieces of information stores visual properties of the respective surface elements that form an element to be simulated, but differs in the purpose of use. The former is information to be used for evaluating the cutting and shading effects due to the beam irradiation and the latter is information to be used for evaluating the re-deposition effect.

Here, the following description will discuss a method by which the matrix computing unit 222 evaluates visual properties of surface elements by using the surface-related matrix. In this case, the method is explained on the assumption that an element to be simulated is constituted by 10 surface elements, that is, surface element 0 to surface element 9.

First, a surface-related matrix is prepared for each of the surface elements 0 to 9 so as to initialize the elements. FIG.

5 is an explanatory drawing that explains the surface-related matrix at the time of initialization. As shown in this Figure, the surface-related matrix has evaluation points that correspond to a number that is set as the item of the number of divisions in the calculation condition storing unit 350. Each of the evaluation points indicates a direction in which a surface element in question is viewed from the surface so that the number of the most-closely adjacent surface element located in this direction and the distance to the surface element are maintained. Since 36 is set in the item of the number of divisions in the example of this Figure, 36 evaluation points are set and each of the evaluation points is initialized so as not to hold any value.

Figure 6:
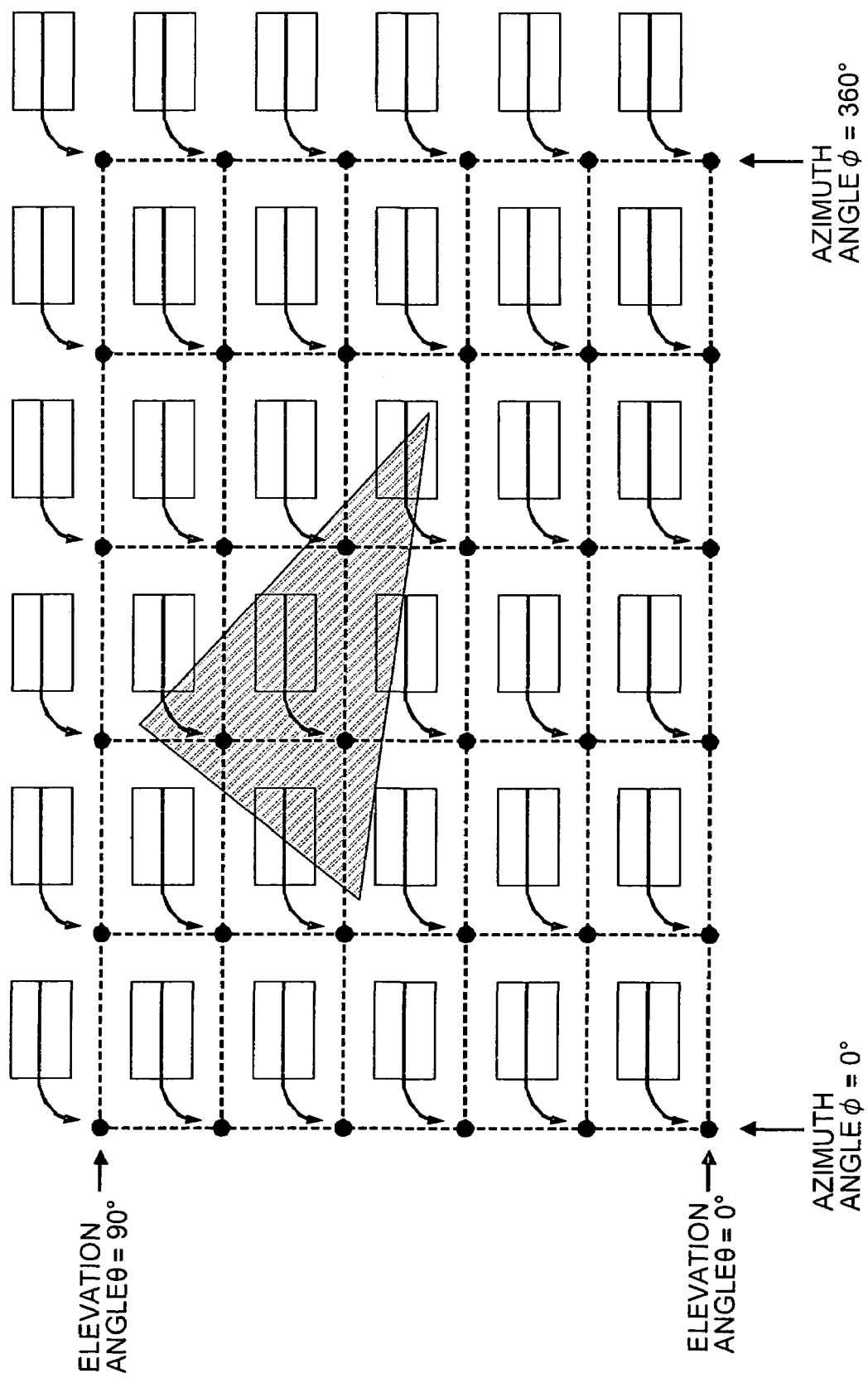
FIG. 6 is an explanatory diagram that explains a surface-related matrix upon mapping.

The matrix computing unit 222 maps other surface elements on this surface-related matrix so that evaluations of visual properties are carried out. FIG. 6 is an explanatory drawing that explains the surface-related matrix at the time of mapping. As explained earlier, each of the surface elements is a polygon such as a triangle, and has a plurality of apexes. Each of the apexes of surface element 1 is mapped on the surface-related matrix of surface element 0 so as to indicate which direction each of the apexes of surface element 1 is located in, when viewed from the surface of surface element 0, and when these points are connected, an image having a polygonal topology such as a triangle is created as shown in the Figure.

Figure 7:
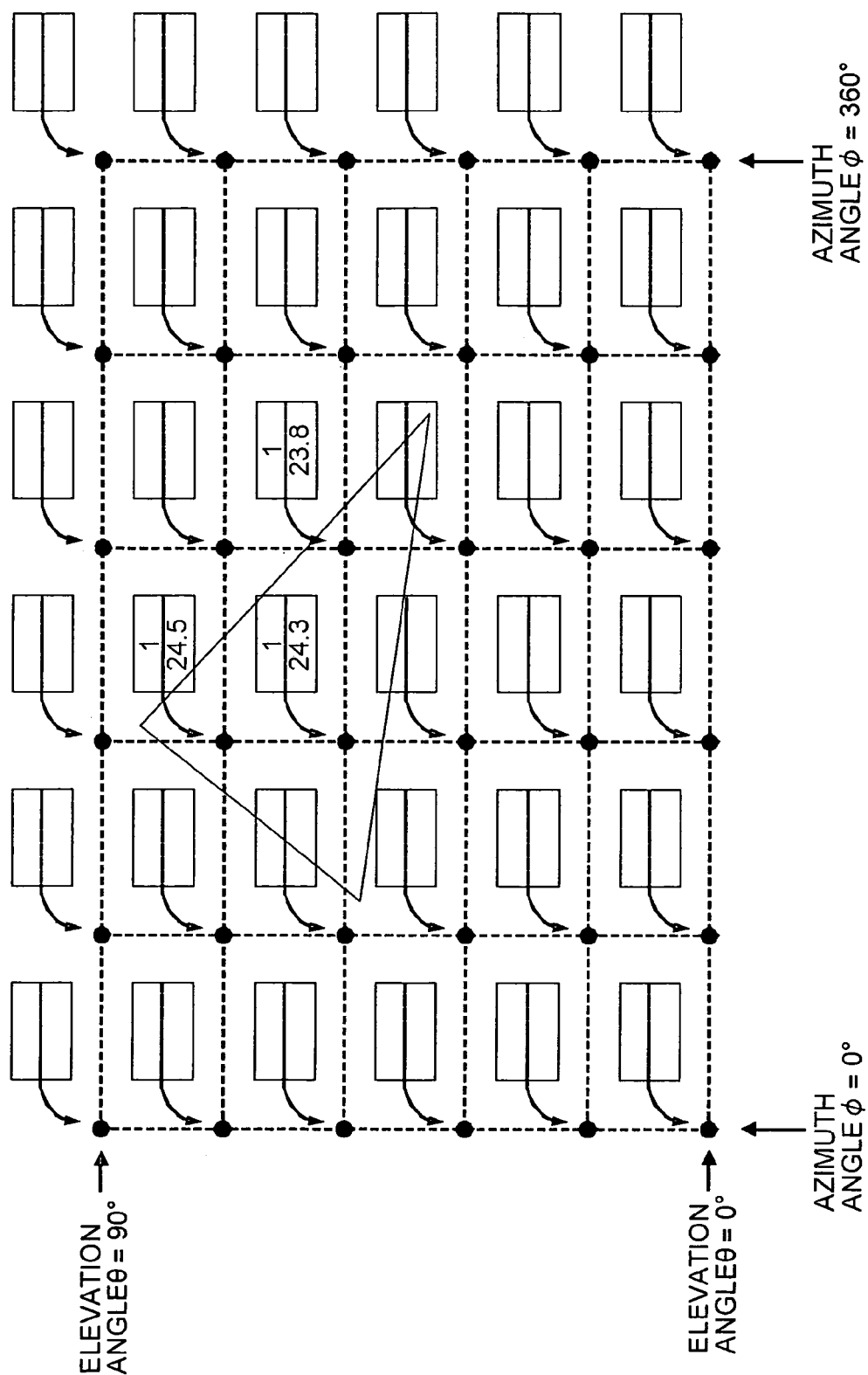
FIG. 7 is an explanatory diagram that explains a surface-related matrix in which surface element numbers and distances are set.

After mapping processes, the number of the surface element thus mapped at each evaluation point in the image formed by mapping and the distance to the corresponding surface element are set. FIG. 7 is an explanatory drawing that explains the surface-related matrix in which the surface element number and the distance are set. As shown in this Figure, on each of evaluation points in the image, the number of surface element 1 and the distance that takes from the center of surface element 0 to reach surface element 1 in the direction toward the corresponding evaluation point are set.

Then, the same mapping process and value setting process for each evaluation point are carried out with respect to the other surface elements 2 to 9. In this case, when an evaluation point has the distance to another surface element set therein, and when the distance is shorter than the distance of a surface element currently mapped, the setting of the surface element number and the distance to the evaluation point is not carried out.

With this manner, when all the surface elements 1 to 9 have been mapped on the surface-related matrix of surface element 0, with the surface element number and the distance being set, each of the evaluation points of the surface-related matrix of surface element 0 is allowed to have the number of the most-closely adjacent surface element located in the corresponding direction and the distance to the surface element set therein. By utilizing this information, it becomes possible to determine whether beam irradiation does not reach surface element 0 by being blocked by another surface element. Moreover, it is possible to determine which surface element is subjected to re-deposition, when surface element 0 is ground and cut by a beam.

Likewise, the matrix computing unit 222 evaluates visual properties by using the surface-related matrix with respect to surface elements 1 to 9.

According to surface-related matrix computing processes, the polar coordinates viewed from the surface elements are finely divided to provide more evaluation points so that visual properties are more accurately evaluated with the simulation results with higher precision; however, in contrast, the calculation time increases. The topology simulation system and the simulation program of the present embodiment allow the user to set the number of divisions in which the polar coordinates are finely divided so that the user can adjust the simulation precision and calculation time.

Moreover, the topology simulation system and simulation program relating to the present embodiment allows each of surface elements to have two surface-related matrixes for use in cutting analysis and re-deposition analysis. The re-deposition analysis-use surface-related matrix storing unit 390 is used for determining which surface element is subjected to re-deposition when a beam is applied to the corresponding surface element so as to be cut. The re-deposition might occur in all the surface elements that are viewed from the corresponding surface element without being shaded by other surface elements even by one portion thereof. Therefore, it is necessary for the re-deposition analysis-use surface-related matrix storing unit 390 to evaluate visual properties with respect to all the directions.

Figure 8:
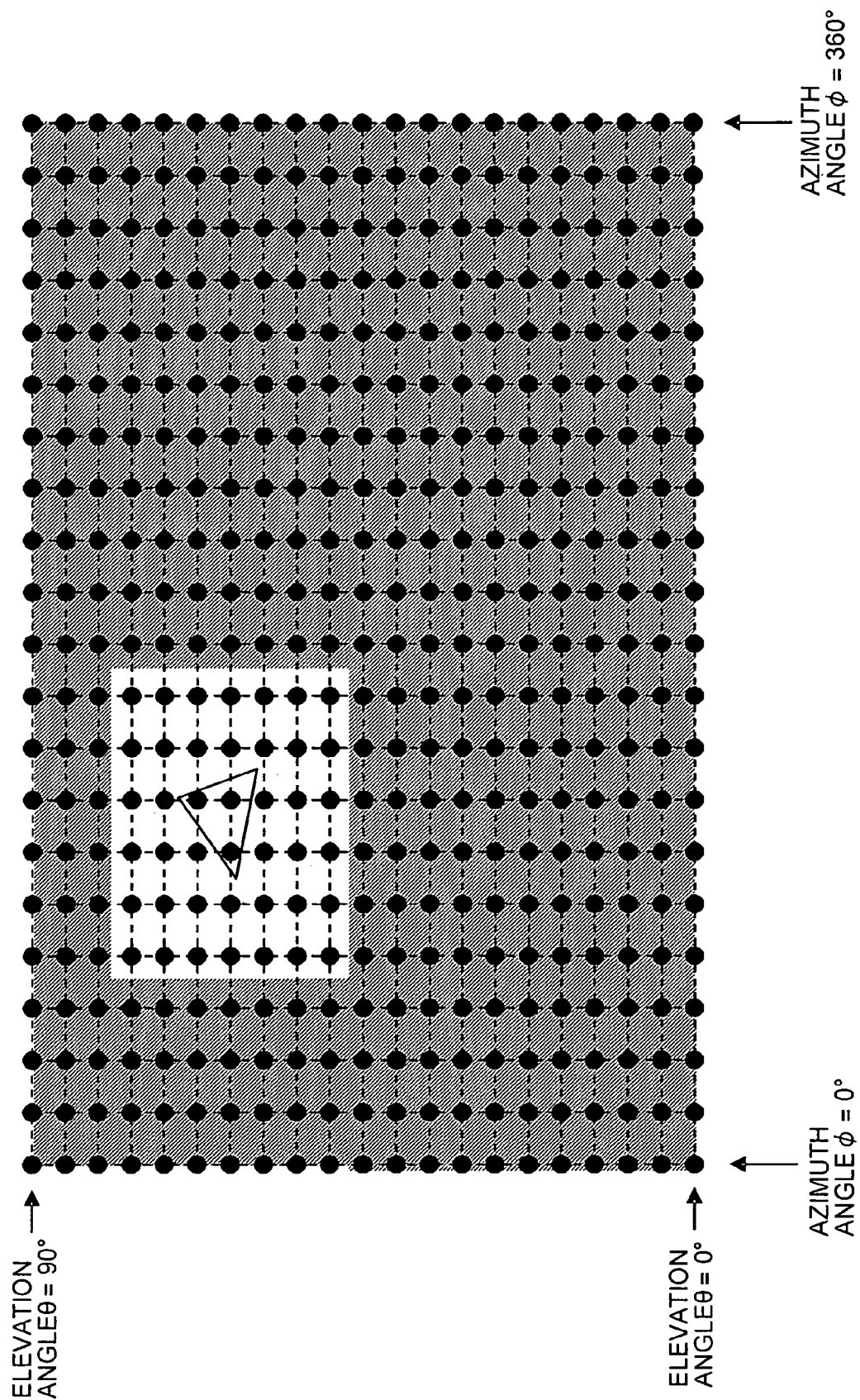
FIG. 8 is an explanatory diagram that explains a cutting analysis-use surface-related matrix.

Here, the cutting analysis-use surface-related matrix storing unit 380 is used for determining whether the corresponding surface element is cut by a beam irradiation, or is not cut since it is shaded by another surface element. The beam incident direction is limited to a direction which is made by adding a divergence angle to the incident angle; therefore, the cutting analysis-use surface-related matrix storing unit 380 needs to evaluate visual properties only in this direction. FIG. 8 is an explanatory drawing that explains the cutting analysis-use surface-related matrix. As shown in this Figure, the beam incident direction corresponds to only one portion of all the evaluation points, and the cutting analysis-use surface-related matrix need not evaluate visual properties of the surface elements with respect to portions other than this range.

As described earlier, increasing the evaluation points of the surface-related matrix makes it possible to accurately evaluate visual properties to obtain simulation results with high precision; in contrast, this causes an increase in the calculation time. However, with respect to the cutting analysis-use surface-related matrix, since it is not necessary to calculate the distances with respect to all the evaluation points, the increase in the calculation time is smaller even when the number of evaluation points increases. Since the re-deposition is a phenomenon that occurs due to cutting, simulating the cutting with high precision makes it possible to improve the simulation precision of the re-deposition, and consequently to improve the precision of the entire simulation results. As described above, by evaluating the surface-related matrix as two separated matrixes, that is, the cutting analysis-use and the re-deposition analysis-use matrixes, it becomes possible to obtain simulation results with high precision in a shorter calculation time.

The following description will discuss a screen that is used for inputting information to the topology simulation system 20 of the present embodiment. Here, these screens show merely one example, and the present invention is not intended to be limited by these screens.

FIG. 9 is a sample drawing that shows an input screen for element initial position information. This screen is used for specifying a position of an element to be simulated in its topology change to confirm a difference between machined topologies of elements depending on positions on the wafer.

As shown in this Figure, on an upper left side of the screen there are columns in which a wafer diameter is inputted and in which a position of an element is inputted as an X-coordinate and a Y-coordinate. Values, inputted here, are registered in a list located on the lower left side of the screen by depressing an addition button, and are also deleted from the list by depressing a deletion button. This list can hold a desired number of combinations of X-coordinate and Y-coordinate indicating the positions of elements.

Moreover, a circle indicating the image of a wafer is drawn on the right half side of the screen, and positions of elements registered in the list located on the lower left side are displayed thereon as points. By selecting any desired position on the circle indicating the wafer image through an input device such as a mouse, the corresponding position can be registered in the list located on the lower left side.

With this manner, in the input screen for element initial position information, the specifying process of the initial position of an element can be carried out in two methods, that is, one method in which the X-coordinate and Y-coordinate are directly inputted and the other method in which selection is made on the circle indicating the image of a wafer, and a plurality of specified initial positions are maintained. Thus, the information, inputted through this input screen, is stored in the element initial position storing unit 310 of the storing unit 300.

FIG. 10 is a sample drawing that shows an input screen for initial surface topology information. This screen is used for inputting a topology prior to machining of an element to be simulated in its topology change. As shown in this Figure, there is a column in which a surface data name is inputted on an upper left side of the screen, and a name of a file in which an initial surface topology of an element is stored is inputted in this column, and by depressing a reading button, the information indicating the surface topology of the element is picked up and stored in the initial surface topology storing unit 320 of the storing unit 300. Here, with respect to the format of the file in which the initial surface topology of the element is stored, any format may be used as long as it is applicable to these topology simulation system, topology simulation method and topology simulation program; and, for example, polygon data of an STL format may be used. Moreover, the file in which the initial surface topology of the element is stored may be formed through any method.

Figures 11, 12:
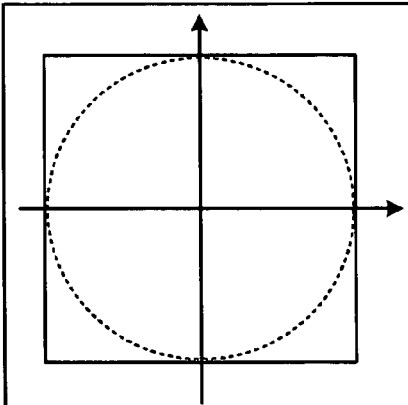
FIG. 11 is a sample diagram of an input screen for process condition information and beam distribution information.
FIG. 12 is a sample diagram of an input screen for calculation condition information.

FIG. 11 is a sample drawing that shows an input screen for process condition information and beam distribution information. This screen is used for inputting machining processes to be simulated and beam distributions in the respective processes.

As shown in this Figure, on the upper left side of the screen, there are columns in which machining time, a wafer tilt angle, a divergence angle, a wafer rotation, a beam intensity distribution, and an incident angle distribution are inputted. The machining time represents time required for the process. The wafer tilt angle represents an angle at which the wafer is tilted in the process. The divergence angle represents an open angle of an ion beam to be applied. The wafer rotation represents a wafer rotation direction and an amount of rotation. The beam intensity distribution represents a change in beam intensity caused by the distance from the center of the wafer, and the incident angle distribution represents a change in beam intensity caused by the incident angle of a beam. The intensity distribution and incident angle distribution are specified by selecting pieces of information having preset values.

Those values, inputted in these input columns, are registered in a list located on a lower portion of a screen by depressing an addition button, and also deleted from the list by depressing a deletion button. According to this list, a desired number of pieces of information relating to machining processes can be held. Moreover, images indicating the beam intensity distribution and the incident angle distribution are displayed on the upper right side of the screen.

With this manner, in the input screens for process condition information and beam distribution information, a plurality of pieces of information relating to respective processes forming machining processes are inputted and maintained. Further, the pieces of information, inputted in these screens, are stored in the beam distribution storing unit 330 and the process condition storing unit 340 of the storing unit 300.

FIG. 12 is a sample drawing that shows an input screen for calculation condition information. This screen is used for specifying precision in simulation processes. When high precision is specified through this screen, the simulation results that are closer to the actual processes are obtained; however, more calculation time is required.

As shown in this Figure, there are columns through which time steps, the number of beam divisions and the number of re-deposition divisions are inputted, on the screen. The time step represents time required for finely dividing machining processes. Each of machining processes, inputted through the screen of FIG. 11, is divided based upon the time specified in the time step; thus, for each of these divided phases, simulation processes for a topology change are carried out to output a final machined topology. Therefore, as the time specified as the time step becomes shorter, the simulation results have improved results, and more time is required in calculations.

Here, the number of beam divisions and the number of re-deposition divisions respectively represent precisions in the cutting analysis-use surface-related matrix storing unit 370 and the re-deposition analysis-use surface-related matrix storing unit 380. These values are also specified by operating a slide bar with high-speed and high-precision being defined on its two ends that is placed beside each of the input columns. As the value specified in each of these items becomes greater, the visual properties of each of surface elements in an element are confirmed more accurately, and the simulation results with higher precision are obtained; however, more time is required in calculations.

With this manner, in the input screen for calculation condition information, the user is allowed to adjust and set the precision of the simulation results and time required for the simulation processes. Pieces of information, inputted through this screen, are stored in the calculation condition storing unit 350 of the storing unit 300.

The following description will discuss the sequence of processes carried out in the topology simulation system 20 shown in FIG. 2. Here, the topology simulation system 20 can simulate the machined topology of each of elements located at a plurality of different positions specified in the screen shown in FIG. 9; however, hereinafter, the description discusses a sequence of processes in which the machined topology of one element is simulated. When the machined topologies of a plurality of elements located at different positions are simulated, the sequence of processes explained here is repeated as many times as the number of the elements.

Figure 13:
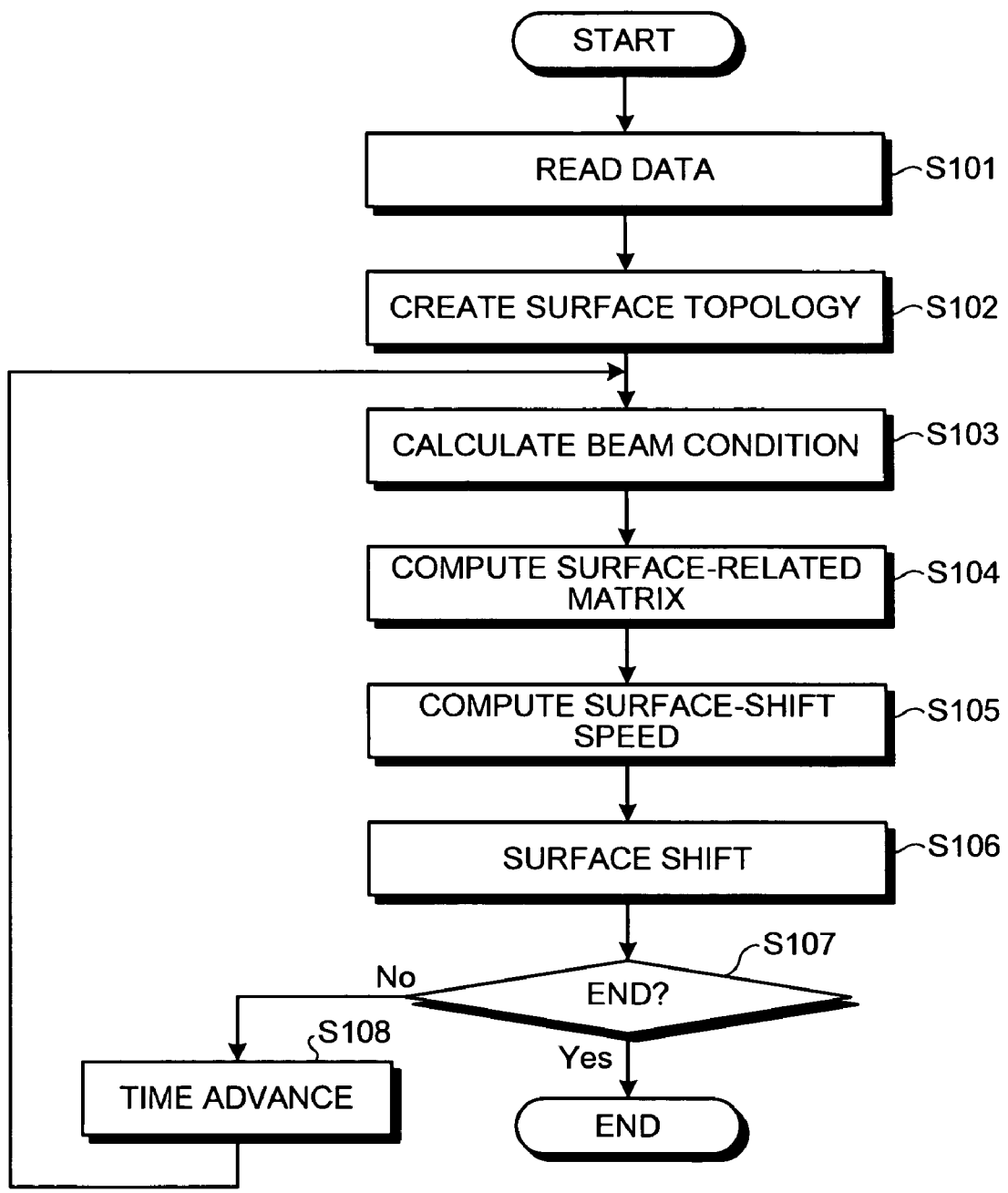
FIG. 13 is a flowchart showing a sequence of simulation processes using a topology-simulation system shown in FIG. 2.

FIG. 13 is a flowchart that shows a sequence of processes carried out by the topology simulation system 20 shown in FIG. 2. As shown in this Figure, the simulation system 20 first reads data required for simulation processes (step S101). The information to be read here includes the element initial position information, the initial surface topology information, the beam distribution information, the process condition information and the calculation condition information, and these pieces of information are inputted by the user through the screens explained in FIGS. 9 to 12, and respectively stored in the element initial position storing unit 310, the initial surface topology storing unit 320, the beam distribution storing unit 330, the process condition storing unit 340, and the calculation condition storing unit 350.

Further, based upon the initial surface topology information thus read, the topology simulation system 20 forms a surface topology of an element to be simulated (step S102). This surface topology is constituted by a number of combined surface elements having polygonal topologies.

Next, the beam condition computing unit 221 carries out calculations on beam conditions (step S103). The beam condition computing unit 221 calculates beam conditions based upon the information read in step S101 and elapsed machining time, and stores the results of calculations in the beam condition storing unit 360. More specifically, based upon information from the element initial position storing unit 310 and the process condition storing unit 340 as well as the elapsed machining time, the current position and the beam incident angle of the element to be simulated are calculated, and these results are applied to the beam distribution storing unit 330 to find the beam intensity so that the results are stored in the beam condition storing unit 360. The beam distribution storing unit 330 does not have information relating to all the positions; therefore, when no information that meets the conditions is present in the beam distribution storing unit 330, the intensity is found by interpolating information of adjacent positions in the corresponding information.

Next, matrix computing unit 222 updates the cutting analysis-use surface-related matrix storing unit 380 and the re-deposition analysis-use surface-related matrix storing unit 390, and evaluates visual properties of the respective surface elements (step S104). Further, the surface shift-speed computing unit 223 calculates the shifting speed of each of the surface elements based upon information of the beam distribution storing unit 330, the cutting analysis-use surface-related matrix storing unit 380 and the re-deposition analysis-use surface-related matrix storing unit 390 (step S105), and according to this shifting speed, each of the surface elements is shifted by a distance corresponding to the time of the time step in the calculation condition storing unit 350 (step S106).

With this manner, the topology simulation system 20 completes processes of one of the phases prepared by finely dividing machining processes. Then, confirmation is made as to whether or not all the machining processes have been completed, and if not completed ("No" is step S107), by allowing the machining time to advance by the time of the time step in the calculation condition storing unit 350 (step S108), processes of steps S103 to S106 are executed to carry out processes for the next phase. Upon completion of the machining processes ("Yes" in step S107), the topology simulation system 20 completes the processes.

Figure 14:
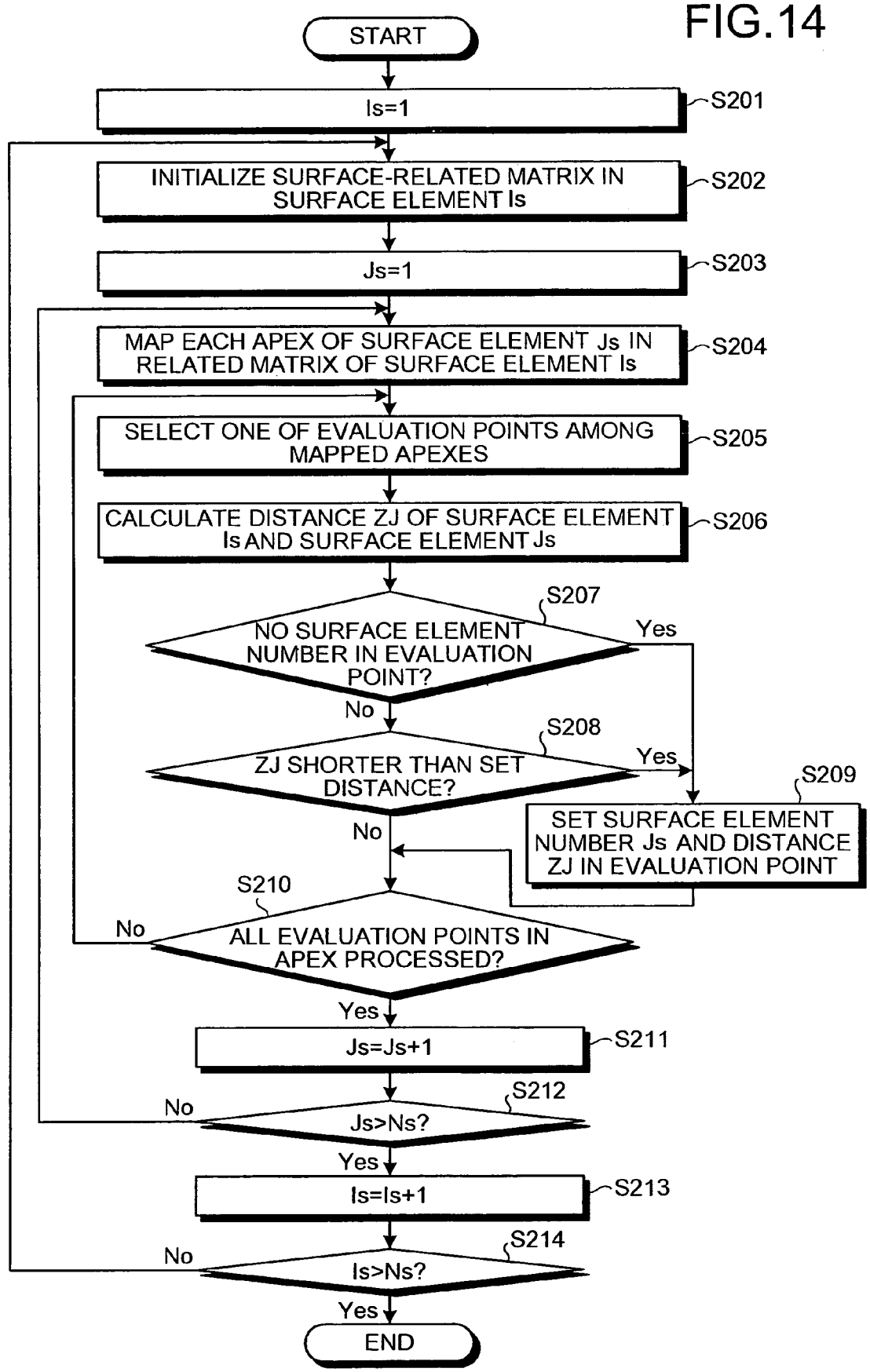
FIG. 14 is a flowchart showing a sequence of surface-related matrix computing processes shown in FIG. 13.

The following description will discuss a sequence of the surface-related matrix computing processes shown in FIG. 13. FIG. 14 is a flowchart that shows the sequence of the surface-related matrix computing processes shown in FIG. 13. These processes are used for evaluating visual properties of each of surface elements that form an element to be simulated, and executed by the matrix computing unit 222.

First, the matrix computing unit 222 selects a first surface element Is (step S201), and initializes the surface related matrix corresponding to the surface element Is (step S202). Then, it selects a surface element Js that is a first evaluation subject (step S203) and maps the respective apexes of this surface element Js on the surface-related matrix of the surface element Is (step S204).

Next, one of evaluation points located in an image having a polygonal topology that has been formed by the mapping is selected (step S205), and the distance ZJ that is required to reach the surface element Js in the advancing direction to the evaluation point from the center of the surface element Is is calculated (step S206). Further, when no surface element number is set on the evaluation point ("Yes" at step 207), or when ZJ is shorter than the distance set in this evaluation point ("Yes" at step S208), the surface element number Js and the distance ZJ are set at the evaluation point (step S209). The matrix computing unit 222 executes the processes from step S205 to step S209 repeatedly until all the evaluation points, located within the polygonal topology created by the mapping, have been processed.

Upon completion of evaluations of visual properties of the surface element Is and the surface element Js, the matrix computing unit 222 selects the next surface element as Js (step S211), and again executes processes from step S204 to step S210 to evaluate visual properties with respect to the surface element Js. When, upon completion of evaluations in visual properties with respect to the surface element Is and all the other surface elements, a surface-related matrix corresponding to the surface element Is has been formed ("yes" at step S212), the matrix computing unit 222 executes processes of step S202 to step S212 with another surface element being defined as the surface element Is, that is, Is=Is+1, as illustrated in step S213. When surface-related matrixes have been formed with respect to all the surface elements, ("yes" at step S214), the surface-related matrix computing processes are completed.

Here, although not clearly shown in the flowchart, each of the surface elements has two kinds of surface-related matrixes, that is, the cutting analysis-use and re-deposition analysis-use surface-related matrixes, and the processes of step S204 to step S210 need to be executed with respect to each of the two kinds of surface-related matrixes.

Figure 15:
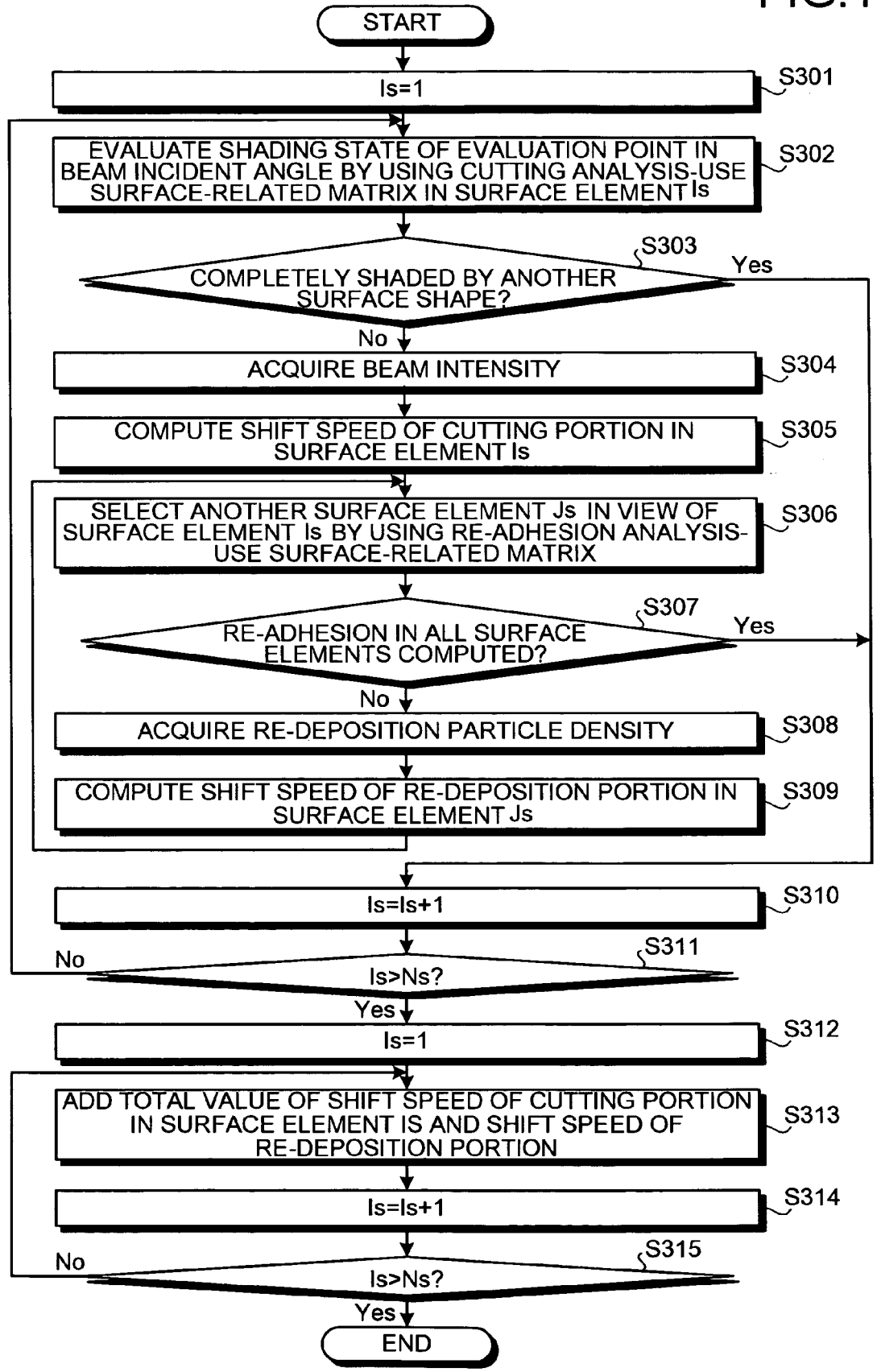
FIG. 15 is a flowchart showing the sequence of surface shift-speed computing processes illustrated in FIG. 13.

Next, the following description will discuss a sequence of surface shift-speed computing processes, shown in FIG. 13. FIG. 15 is a flowchart that shows the sequence of surface shift-speed computing processes shown in FIG. 13. These processes are carried out so as to calculate what level of speed each surface element is shifted at, in response to cutting by beam irradiation and re-deposition following the cutting, and are executed by the surface shift-speed computing unit 223.

First, the surface shift-speed computing unit 223 selects a first surface element Is (step S301). Then, referring to the cutting analysis-use surface-related matrix corresponding to the surface element Is, it confirms whether or not evaluation points, located in the beam incident direction, are shaded by another surface element (step S302). Here, in the case when all the evaluation points located in the beam incident direction are shaded by other surface elements ("Yes" at step S303), since it is considered that no surface element is ground and cut by the beam, the processes are resumed from step S302, with another surface element being defined as Is.

When at least one of the evaluation points located in the beam incident direction is not shaded by another surface element ("No" at step S303), the beam intensity is acquired from the beam condition storing unit 360 (step S304) so that the shifting speed of the surface element Is derived from the cutting is calculated (step S305). Here, the beam intensity stored in the beam condition storing unit 360 is a value to be applied to a face that is horizontal to the wafer; therefore, when the surface element Is is not horizontal to the wafer surface, it is necessary to access the beam condition computing unit 221 to acquire the beam incident angle and the intensity.

The shifting speed Vs of the surface element derived from the cutting can be found by using Eq. (1). According to Eq. (1), (θ, φ) represent the elevation angle and azimuth angle in the polar coordinate system on each of the surface elements. Here, Fbeam (θ, φ) represents the intensity of an incoming beam in the direction indicated by (θ, φ), and ER (θ) indicates an etching rate of the surface material at the incident angle θ.

$$Vs = \iint F\text{beam}(\theta, \phi) \cdot ER(\theta) \cdot \sin\theta\, d\theta\, d\phi \qquad (1)$$

Next, referring to the re-deposition analysis-use surface-related matrix corresponding to the surface element Is, a surface element Js even one portion of which is viewed from the surface element Is is selected (step S306). More specifically, in the re-deposition analysis-use surface-related matrix, one of the surface elements whose surface element number is set on evaluation points is selected.

Further, the re-deposition particle density is found from the cutting speed of the surface element Is and the like (step S308), and the shifting speed of the surface element Js derived from the re-deposition is calculated (step S309). The shifting speed Vs of the surface element derived from the re-deposition can be found by Eq. (2). In Eq. (2), (θ, φ) represent the elevation angle and azimuth angle in the polar coordinate system on each of the surface elements. Moreover, Fdepo (θ, φ) represents the density of incoming re-deposition particles in the direction indicated by (θ, φ).

$$Vs = \iint F\text{depo}(\theta, \phi) \cdot \sin\theta\, d\theta\, d\phi \qquad (2)$$

The surface shift-speed computing unit 223 repeats processes from step S306 to step S309 until all the surface elements whose surface element numbers are set on the evaluation points in the re-deposition analysis-use surface-related matri8x of the surface element Is have been processed. When all the surface elements whose surface element numbers are set have been processed ("Yes" at step S307), the processes are resumed from step S302 with another surface element being defined as Is, that is, Is=Is+1, as illustrated in S310 (and so forth until the last surface element Is has been processed, that is, "yes" in step S311. According to this manner, the surface shifting speed derived from the cutting is found with respect to each of the surface elements, and the surface shifting speed, derived from the re-deposition occurring on another surface element following the cutting, is found.

Further, the surface shift-speed computing unit 223 again selects the first surface element Is (step S312), and obtains the total value of the shifting speed derived from the cutting of the surface element Is and the shifting speed derived from the re-deposition of the surface element Is derived from the cutting of another surface element so that this value is set as the surface shifting speed of the surface element Is (step S313). The surface shift-speed computing unit 223 executes step S313 repeatedly until the last surface element has been processed ("Yes" at step S315) with another surface element being defined as Is (step S314). When the surface shifting speeds of all the surface elements have been found according to this manner, the surface shift-speed computing process is completed.

As described above, in the present embodiment, the matrix computing unit 222 is designed so as to three-dimensionally evaluate visual properties of surface elements that constitute an element to be simulated by using the surface-related matrix; therefore, it is possible to obtain simulation results in which the shading effect and re-deposition effect have been properly taken into consideration.

Moreover, the present embodiment allows the user to freely set the number of evaluation points of the surface-related matrix so that the user can adjust the level of precision in the simulation results and the calculation time required for the simulation.

Furthermore, the present embodiment has an arrangement in which the beam condition computing unit 221 calculates the incident direction and the intensity of a beam in each of phases in simulation processes; therefore, a difference in machined topologies of elements that are formed in different positions on the same wafer is easily obtained through the simulation.

As described above, the topology simulation system, the topology simulation method and the topology simulation program according to the present invention are effectively used for simulating a topology change upon finely machining a semiconductor and the like, and are suited for an application in which simulation results with high precision need to be obtained efficiently.

According to the present invention, visual properties influenced by a positional relationship in the three-dimensional space between surface elements obtained by dividing each of the surfaces of a product to be simulated into polygonal topologies are evaluated, and by using information of the visual properties, a simulation process to which a shading effect and a re-deposition effect have been reflected can be carried out; therefore, it becomes possible to obtain simulation results with high precision.

According to the present invention, the user is allowed to freely change the number of evaluation points of a surface-related matrix used for evaluating visual properties influenced by a positional relationship in the three-dimensional space between surface elements obtained by dividing each of the surfaces of a product to be simulated into polygonal topologies; therefore, the user, who operates a simulation process, is allowed to adjust the precision of simulation results and time required for the simulation process.

According to the present invention, two kinds of surface-related matrixes used for evaluating the visual properties in the three-dimensional space, that is, cutting analysis-use and re-deposition analysis-use surface-related matrixes, are used; therefore, the cutting simulation, which requires higher precision, can be carried out with high precision in a shorter period of time, making it possible to obtain simulation results with high precision in a shorter period of time.

According to the present invention, since beam conditions in each of phases of simulation are calculated from input information, the user who carries out a simulation process does not need to calculate beam conditions in a separate manner for each of the phases so as to input them, thereby making it possible to easily provide accurate simulation results.

According to the present invention, since the beam conditions are calculated with the position of a product to be simulated on a wafer being incorporated therein, a difference in topologies depending on positional differences on the wafer in-plane can be simulated.

According to the present invention, a plurality of positions on a wafer of a product to be simulated are stored so that a machined topology at each of the positions can be simulated; therefore, it becomes possible to easily compare differences in topologies that occur depending on positional differences on the wafer in-plane.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A topology simulation system, comprising:
    a matrix computing unit that creates a surface-related matrix by evaluating visual properties according to a positional relationship in a three-dimensional space between surface elements obtained by dividing each surface of a product into a polygon, wherein polar coordinates viewed from the surface elements are divided as specified to allow adjustment of simulation precision and calculation time;
    a speed computing unit that calculates a surface shifting speed of at least one of the surface elements to which a shading effect and a re-deposition effect is reflected by using the surface-related matrix created by the matrix computing unit
    wherein operation of said matrix computing unit and said speed computing unit cause a change to be simulated in a topology of a product by a micro-machining process; and
    a user interface unit that outputs the topology of the product after the change is simulated.

2. The topology simulation system according to claim 1, wherein the matrix computing unit evaluates the visual properties as the surface-related matrix constituted by evaluation points obtained by dividing polar coordinates into an arbitrary number of divisions.

3. The topology simulation system according to claim 1, wherein
    the matrix computing unit evaluates the visual properties as a surface-related matrix for cutting analysis-use and a surface-related matrix for re-deposition analysis-use, and
    the surface shift-speed computing unit calculates a surface shifting speed of the surface element due to cutting and a surface shifting speed of the surface element due to re-deposition by using the surface-related matrix for cutting analysis-use and the surface-related matrix for re-deposition analysis-use, respectively.

4. A topology simulation system, comprising:
    a user interface control unit that receives inputs of a machining process condition in micro-machining process and beam characteristics of a beam used for the micro-machining process, said inputs including a specification of divided polar coordinates viewed from surface elements;
    a beam condition calculating unit that calculates intensity and direction of the beam to be applied to a product to carry out the micro-machining process, based on the machining process condition and the beam characteristics
    wherein operation of said matrix computing unit and said speed computing unit cause a change to be simulated in a topology of the product by the micro-machining process; and a user interface unit that outputs the topology of the product after the change is simulated.

5. The topology simulation system according to claim 4, wherein
    the user interface control unit further receives a position at which the product is formed in a system that carries out the micro-machining process, and
    the beam condition calculating unit calculates the intensity and the direction of the beam based on the machining process condition, the beam characteristics, and the position.

6. The topology simulation system according to claim 5, further comprising an element position storing unit that stores at least one position at which the product is formed in the system that carries out the micro-machining process, wherein
    the beam condition calculating unit calculates the intensity and the direction of the beam corresponding to the at least one position stored in the element position storing unit.

7. A method, comprising:
    creating a surface-related matrix by evaluating visual properties according to a positional relationship in a three-dimensional space between surface elements obtained by dividing each surface of a product into a polygon, wherein polar coordinates viewed from the surface elements are divided as specified to allow adjustment of simulation precision and calculation time;
    calculating a surface shifting speed of at least one of the surface elements to which a shading effect and a re-deposition effect is reflected by using the surface-related matrix created;
    wherein said creating and calculating simulate a change in a topology of the product by a micromachining process; and
    outputting the topology of the product after the change is simulated.

8. The method according to claim 7, wherein the creating includes evaluating the visual properties as the surface-related matrix constituted by evaluation points obtained by dividing polar coordinates into an arbitrary number of divisions.

9. The method according to claim 7, wherein
    the creating includes evaluating the visual properties as a surface-related matrix for cutting analysis-use and a surface-related matrix for re-deposition analysis-use, and
    the calculating includes calculating a surface shifting speed of the surface element due to cutting and a surface shifting speed of the surface element due to re-deposition by using the surface-related matrix for cutting analysis-use and the surface-related matrix for re-deposition analysis-use, respectively.

10. A method, comprising:
    receiving inputs of a machining process condition in a micro-machining process and beam characteristics of a beam used for the micro-machining process, said inputs including a specification of divided polar coordinates viewed from surface elements;
    calculating intensity and direction of the beam to be applied to a product to carry out the micro-machining process, based on of the machining process condition and the beam characteristics
        wherein said receiving and calculating simulate a change in a topology of the product by the micro machining process; and
        outputting the topology of the product after the change is simulated.

11. The method according to claim 10, further comprising receiving a position at which the product is formed in a system that carries out the micro-machining process, wherein the calculating includes calculating the intensity and the direction of the beam based on the machining process condition, the beam characteristics, and the position.

12. The method according to claim 11, further comprising storing at least one position at which the product is formed in the system that carries out the micro-machining process, wherein
the calculating includes calculating the intensity and the direction of the beam corresponding to the at least one position stored at the storing.

13. A computer-readable recording medium that stores a computer program, the computer program making a computer execute:
creating a surface-related matrix by evaluating visual properties according to a positional relationship in a three-dimensional space between surface elements obtained by dividing each surface of a product into a polygon, wherein polar coordinates viewed from the surface elements are divided as specified to allow adjustment of simulation precision and calculation time;
calculating a surface shifting speed of surface elements to which a shading effect and a re-deposition effect is reflected by using the surface-related matrix created
wherein said creating and calculating simulate a change in a topology of the product by a micromachining process; and
outputting the topology of the product after the change is simulated.

14. The computer-readable recording medium according to claim 13, wherein the creating includes evaluating the visual properties as the surface-related matrix constituted by evaluation points obtained by dividing polar coordinates into an arbitrary number of divisions.

15. The computer-readable recording medium according to claim 13, wherein
the creating includes evaluating the visual properties as a surface-related matrix for cutting analysis-use and a surface-related matrix for re-deposition analysis-use, and
the calculating includes calculating a surface shifting speed of the surface element due to cutting and a surface shifting speed of the surface element due to re-deposition by using the surface-related matrix for cutting analysis-use and the surface-related matrix for re-deposition analysis-use, respectively.

16. A computer-readable recording medium that stores a computer program, the computer program making a computer execute:
receiving inputs of a machining process condition in a micro-machining process and beam characteristics of a beam used for the micro-machining process, said inputs including a specification of divided polar coordinates viewed from surface elements;
calculating intensity and direction of the beam to be applied to a product to carry out the micro-machining process, based on the machining process condition and the beam characteristics
wherein said receiving and calculating simulate a change in a topology of the product by the micro machining process; and
outputting the topology of the product after the change is simulated.

17. The computer-readable recording medium according to claim 16, wherein
the computer program further makes the computer execute receiving a position at which the product is formed in a system that carries out the micro-machining process, and
the calculating includes calculating the intensity and the direction of the beam based on the machining process condition, the beam characteristics, and the position.

18. The computer-readable recording medium according to claim 17, wherein
the computer program further makes the computer execute storing at least one position at which the product is formed in a system that carries out the micro-machining process, and
the calculating includes calculating the intensity and the direction of the beam corresponding to the at least one position stored at the storing.

* * * * *